United States Patent [19]

Kumashiro

[11] Patent Number: 5,570,204
[45] Date of Patent: Oct. 29, 1996

[54] IMAGE READER WITH FLARE PREVENTION USING LIGHT SHIELD PLATES

[75] Inventor: Toshiaki Kumashiro, Ebina, Japan

[73] Assignee: Ricoh Company, Ltd., Tokyo, Japan

[21] Appl. No.: 364,757

[22] Filed: Dec. 27, 1994

[30] Foreign Application Priority Data

Dec. 28, 1993 [JP] Japan .................................. 5-334666

[51] Int. Cl.$^6$ ............................ H04N 1/04; H04N 5/225; H01L 27/00; G02B 27/10
[52] U.S. Cl. ........................ 358/471; 358/475; 358/482; 358/483; 358/494; 250/208.1; 250/239; 250/578.1; 359/619; 359/625; 359/627; 348/340
[58] Field of Search ................................. 358/471, 474, 358/475, 482, 483, 494, 497; 250/216, 239, 578.1, 208.1; 348/340; 359/619, 625, 627; H04N 1/40, 1/04; H01L 27/00; H01J 5/02, 40/14, 5/225; G02B 27/10

[56] References Cited

U.S. PATENT DOCUMENTS 4,739,159  4/1988  Inokuchi ................................. 358/494
5,363,240  11/1994  Miyashita ................................. 359/625

FOREIGN PATENT DOCUMENTS

4-245765  9/1992  Japan .

*Primary Examiner*—Kim Yen Vu
*Assistant Examiner*—Kimberly A. Williams
*Attorney, Agent, or Firm*—Oblon, Spivak, McClelland, Maier & Neustadt, P.C.

[57]  ABSTRACT

An image reader has a light source for illuminating an original; a lens array having many convex lenses arranged at an equal interval and converging light reflected on the original; a roof mirror array having roof type reflecting faces arranged at the same interval as the convex lenses and reflecting light transmitted through the lens array; a one-dimensional image sensor for photoelectrically converting the reflected light from the roof mirror array; and light shield plates arranged between the convex lenses of the lens array. In this image reader, it possible to reliably avoid generation of flare caused by light passing around between adjacent convex lenses of the lens array. Further, for example, the quality of a read image can be improved by preventing rise of a black output level, interruption of thin lines of the image, etc.

9 Claims, 11 Drawing Sheets

IMAGE READER WITH FLARE PREVENTION USING LIGHT SHIELD PLATES

BACKGROUND OF THE INVENTION

1. Field of the Invention

The present invention relates to an image reader used in a facsimile telegraph, an image scanner, etc. More particularly, the present invention relates to an image reader made compact by using a roof mirror lens array.

2. Description of the Related Art

Recently, a demand for a more compact image reader having higher performance has been increased as a facsimile telegraph, an image scanner, etc. are personally used.

Figure 1:
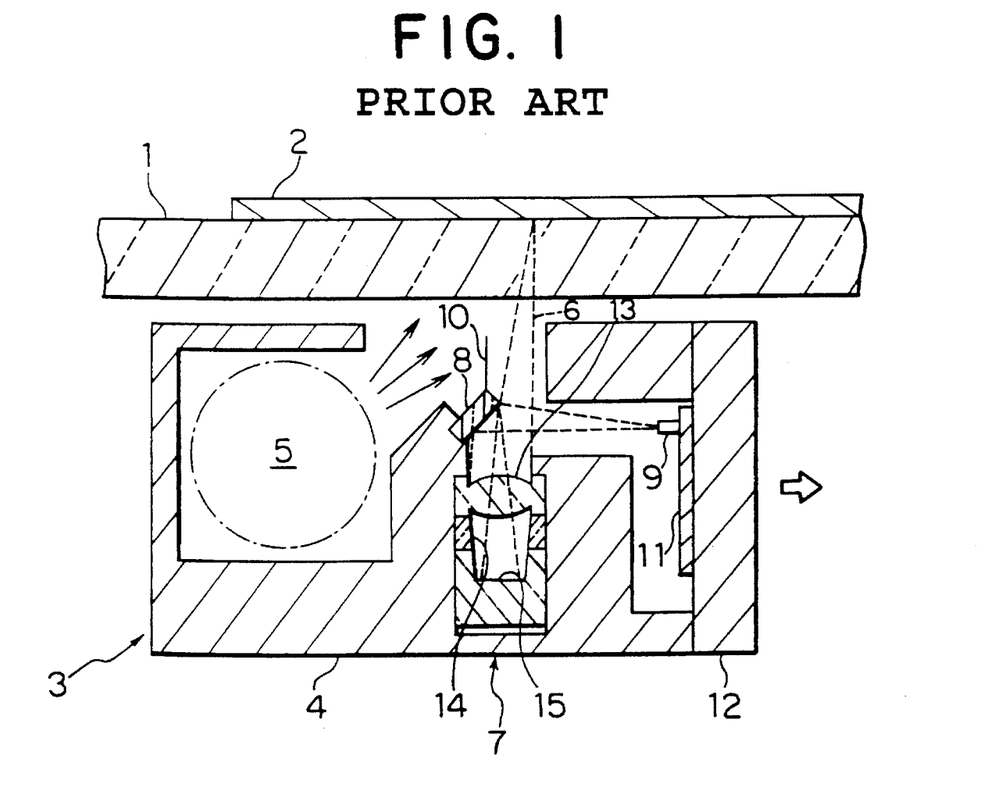
FIG. 1 is a view showing the construction of a general image reader.

FIG. 1 is a cross-sectional view showing a main portion of a general image reader for satisfying such a demand. For example, this image reader is shown in Japanese Patent Application Laying Open (KOKAI) No. 4-245765.

In FIG. 1, image information of an original 2 arranged on a glass stage 1 is read by a reading unit 3 moved in a cross scanning direction along a lower face of the glass stage 1.

The reading unit 3 has a light source 5, a roof mirror-lens array 7, an optical path separating mirror 8 and a one-dimensional image sensor 9 within a case 4. The light source 5 illuminates the original 2 through the glass stage 1. The roof mirror lens array 7 converges light reflected on the original 2 and this converged light 8 is reflected on the roof mirror lens array 7. In the following description, the roof mirror lens array 7 is called RMLA. The optical path separating mirror 8 perpendicularly refracts the reflected light from the roof mirror lens array 7. The one-dimensional image sensor 9 separates the light received from the optical path separating mirror 8 into pixels and photoelectrically converts this light. The one-dimensional image sensor 9 outputs a series of electric signals corresponding to image information on one line of the original 2 in a main scanning direction. A shield plate 10 is arranged to prevent stray light from the light source 5. Reference numerals 11 and 12 respectively designate a substrate of the one-dimensional image sensor 9 and a base for attaching the substrate 11 thereto.

Figure 2:
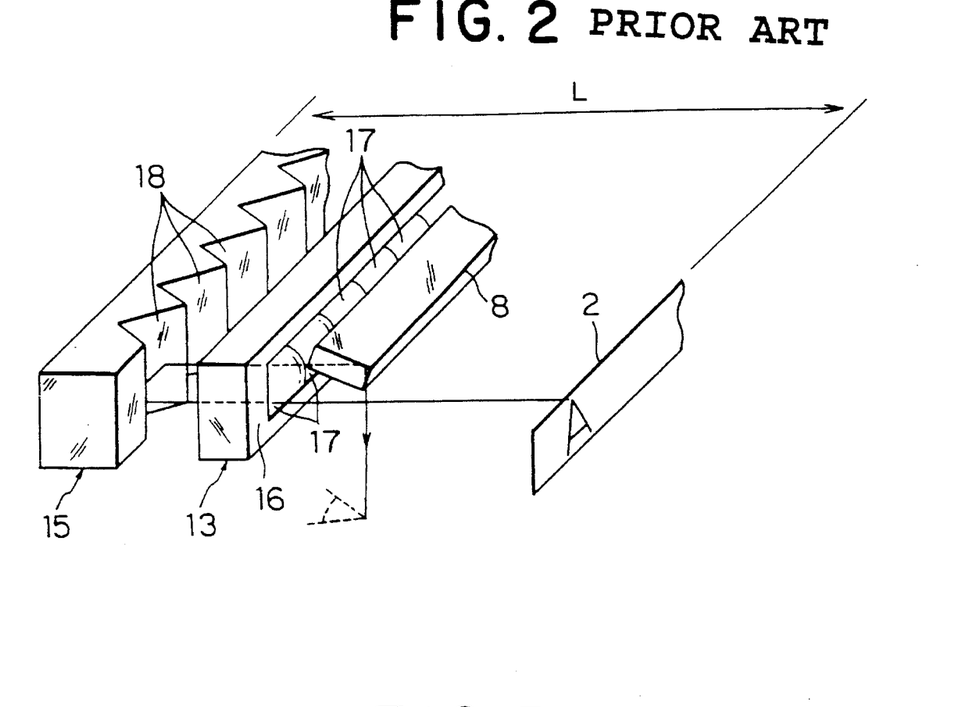
FIG. 2 is a view showing an external appearance of a main portion of the general image reader.

The roof mirror lens array (RMLA) 7 is constructed by a lens array 13, an intermediate member 14 and a roof mirror array 15. In the following description, the lens array 1S and the roof mirror array 15 are respectively called LA and RMA. External appearances of the lens array 13 and the roof mirror array 15 are shown in FIG. 2.

Figure 3:
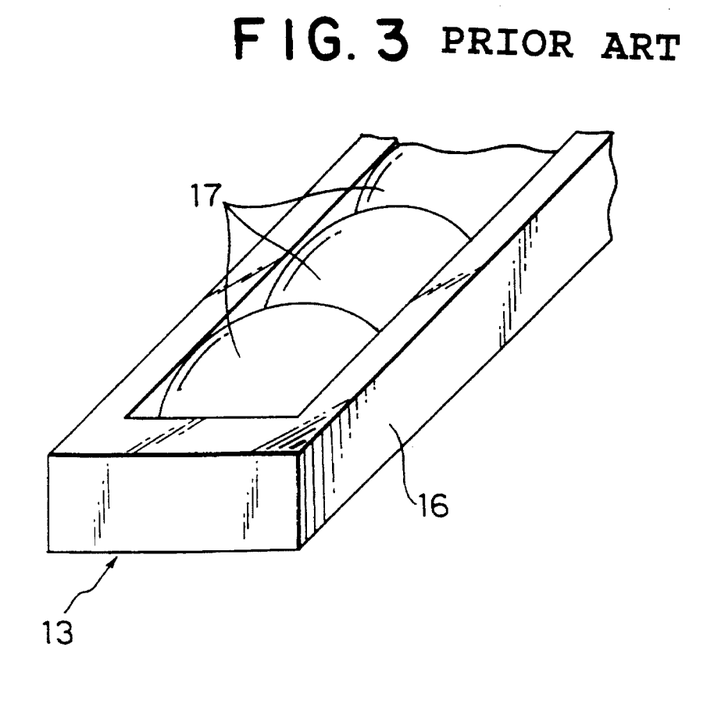
FIG. 3 is a view showing an external appearance of a portion of a lens array (LA) of the general image reader.

In FIG. 3, the lens array (LA) 13 has an elongated frame body 18 and many convex lenses 17 arranged in a line inside the frame body 18 and equally spaced from each other. The frame body 18 and the convex lenses 17 are integrally formed by pressing and molding a transparent material such as plastic, etc. The roof mirror array (RMA) 15 has many roof type reflecting faces 18 arranged at the same interval as the convex lenses 17. For example, each of the roof type reflecting faces 18 is finished as a mirror face by a finishing technique such as evaporation, etc.

In accordance with the roof mirror lens array 17 constructed above, the reflected light from the original 2 passes through the lens array 13 and is reflected on the roof mirror array 15. An optical axis of this reflected light is bent by the optical path separating mirror. Thereafter, for example, an alphabet image A is focused and formed on a light receiving face of the one-dimensional image sensor 9 in FIG. 2.

Accordingly, an entire height of the image reader can be reduced in accordance with a distance L from the original 2 to the roof mirror array 15 so that the image reader can be made compact.

However, the general image reader using such a roof mirror lens array (RMLA) takes no sufficient light shielding action between many convex lenses constituting the lens array (LA). Therefore, flare tends to be caused by light passing around between adjacent convex lenses. Accordingly, for example, an output level of a black portion of the image rises so that this black portion seems gray. Otherwise, thin lines of the image are interrupted by deterioration of resolution characteristics generally evaluated by the concept of a modulation transfer function (MTF). Accordingly, there are technical subjects to be improved with respect to the quality of a read image.

Figure 4A:
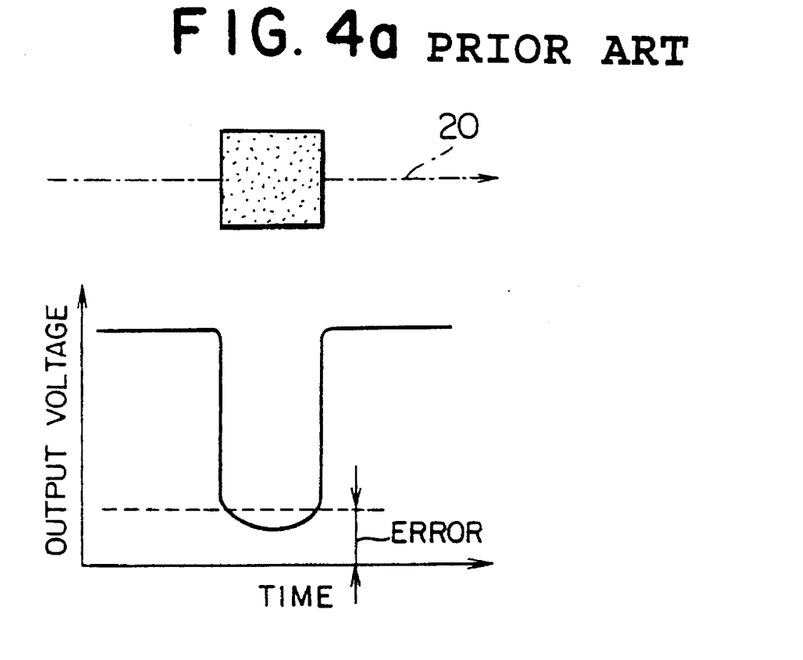
Figure 4B:
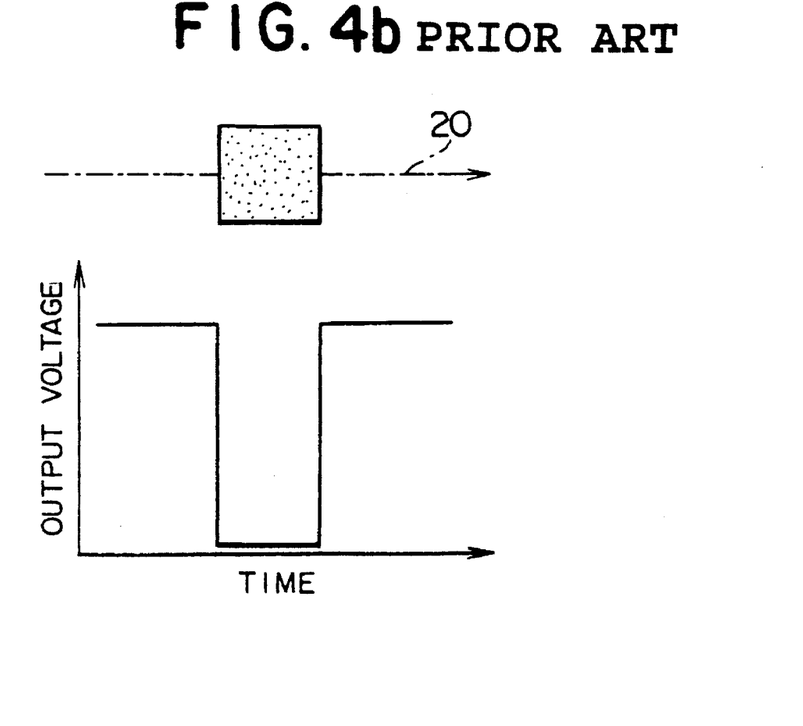

Each of FIGS. 4a and 4b is a view for explaining generation of flare and shows a conceptual view provided when a black portion shown by a black square mark is scanned along a scanning line 20. In the case of flare generation shown in FIG. 4a, an output voltage level of the black portion is slightly higher than a minimum voltage level corresponding to a dark output level of the one-dimensional line sensor. This slight higher portion of the output voltage as a rising level portion corresponds to a passing-around portion of light from white portions before and after the black portion. When there is no passing-around light, no flare is generated as shown in FIG. 4b. In FIG. 4a, an error in black level is clearly recognized in comparison with FIG. 4b.

SUMMARY OF THE INVENTION

It is therefore an object of the present invention to provide an image reader for reliably avoiding generation of flare caused by light passing around between adjacent convex lenses of a lens array, and improving the quality of a read image by preventing rise of a black output level, interruption of thin lines of the image, etc.

In accordance with a first construction of the present invention, the above object can be achieved by an image reader comprising a light source for illuminating an original; a lens array having many convex lenses arranged at an equal interval and converging light reflected on the original; a roof mirror array having roof type reflecting faces arranged at the same interval as the convex lenses and reflecting light transmitted through the lens array; a one-dimensional image sensor for photoelectrically converting the reflected light from the roof mirror array; and light shield plates arranged between the convex lenses of the lens array.

In accordance with a second construction of the present invention, the image reader in the first construction further comprises a frame body for holding the light shield plates at an equal interval and the frame body is arranged on an incident light side of the lens array.

In accordance with a third construction of the present invention, the image reader in the first construction further comprises a frame body for holding the light shield plates at an equal interval and grooves are formed at an equal interval in a case for holding the lens array such that the light shield plates are respectively engaged with the grooves.

In accordance with a fourth construction of the present invention, grooves are formed at an equal interval in a case for holding the lens array in the first construction such that the light shield plates are independently engaged with the respective grooves.

In accordance with a fifth construction of the present invention, the above object can be also achieved by an image reader comprising a light source for illuminating an original; a lens array having many convex lenses arranged at an equal interval and converging light reflected on the original; a roof mirror array having roof type reflecting faces arranged at the same interval as the convex lenses and reflecting light transmitted through the lens array; a one-dimensional image sensor for photoelectrically converting the reflected light from the roof mirror array; and many light shield plates attached to the light source such that an attaching interval of the light shield plates is set to be equal to the interval of the convex lenses.

In accordance with a sixth construction of the present invention, the above object can be also achieved by an image reader comprising a light source having many point light sources for illuminating an original; a lens array having many convex lenses arranged at an equal interval and converging light reflected on the original; a roof mirror array having roof type reflecting faces arranged at the same interval as the convex lenses and reflecting light transmitted through the lens array; a one-dimensional image sensor for photoelectrically converting the reflected light from the roof mirror array; and many light shield plates attached to the light source such that an attaching interval of the light shield plates is set to be equal to an interval of the point light sources; each of the light shield plates being approximately located in an intermediate position between the point light sources, or being located just above each of the point light sources.

In accordance with a seventh construction of the present invention, the above object can be also achieved by an image reader comprising a light source having many point light sources for illuminating an original; a lens array having many convex lenses arranged at an equal interval and converging light reflected on the original; a roof mirror array having roof type reflecting faces arranged at the same interval as the convex lenses and reflecting light transmitted through the lens array; a one-dimensional image sensor for photoelectrically converting the reflected light from the roof mirror array; and a light shielding wall surrounding each of the point light sources and continuous by a predetermined distance in an irradiating direction of light.

In accordance with an eighth construction of the present invention, the above object can be also achieved by an image reader comprising a light source for illuminating an original; a lens array having many convex lenses arranged at an equal interval and converging light reflected on the original; a roof mirror array having roof type reflecting faces arranged at the same interval as the convex lenses and reflecting light transmitted through the lens array; a one-dimensional image sensor for photoelectrically converting the reflected light from the roof mirror array; and many light shield plates interposed and arranged between the light source and the original in a longitudinal direction of the light source.

In accordance with a ninth construction of the present invention, an arranging interval of the light shield plates is set to be equal to the interval of the roof type reflecting faces of the roof mirror array in the eighth construction.

In accordance with a tenth construction of the present invention, the interval of a light shield plate located near an arranging end of the light shield plates is set to be wider than intervals of the other light shield plates in the eighth construction.

In the first construction of the image reader, it is possible to prevent light from passing around and shield this light by the light shield plates between adjacent convex lenses of the lens array.

In the second construction of the image reader, the interval of the light shield plates can be accurately held by the frame body.

In the third construction of the image reader, the interval of the light shield plates can be accurately held by the grooves on a case side. Further, it is possible to prevent the light shield plates from being moved and shaken by reliably engaging the light shield plates with the respective grooves.

In the fourth construction of the image reader, each of the light shield plates can be formed in a simple shape such as a plate shape so that cost of the image reader can be reduced.

In the fifth construction of the image reader, it is possible to prevent light from passing around and shield this light by the light shield plates arranged on a side of the light source.

In the sixth construction of the image reader, it is possible to prevent light from passing around and shield this light by the light shield plates arranged on a side of the light source. Further, a distribution of light energy can be uniformed in a longitudinal direction of the light source.

In the seventh construction of the image reader, distribution characteristics of light energy of the light source using point light sources can be separately corrected every point light source.

In the eighth and ninth constructions of the image reader, it is possible to prevent light from passing around and shield this light by the light shield plates arranged on a side of the light source.

In the tenth construction of the image reader, an amount of light of the light source in each of both end portions thereof in a longitudinal direction of this light source is increased in comparison with the other portions. Accordingly, for example, when a fluorescent lamp is used, it is possible to obtain suitable light distribution characteristics considering deterioration of the fluorescent lamp with the passage of time.

Further objects and advantages of the present invention will be apparent from the following description of the preferred embodiments of the present invention as illustrated in the accompanying drawings.

BRIEF DESCRIPTION OF THE DRAWINGS

each of FIGS. 4a and 4b is a view for explaining disadvantages of the general image reader;

each of FIGS. 11a and 11b is a view showing the construction of an image reader having a sixth construction in accordance with one embodiment of the present invention;

FIG. 15b is a characteristic graph of the image reader having the tenth construction shown in FIG. 15a.

DESCRIPTION OF THE PREFERRED EMBODIMENTS

The preferred embodiments of an image reader in the present invention will next be described in detail with reference to the accompanying drawings.

Figure 5:
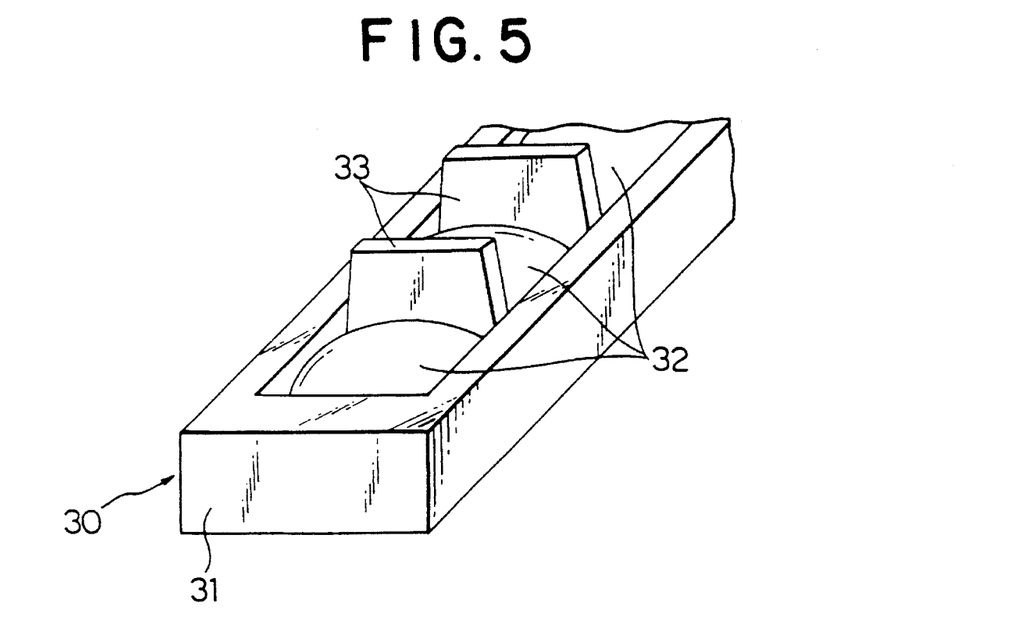
FIG. 5 is a view showing the construction of an image reader having a first construction in accordance with one embodiment of the present invention.

(1) FIG. 5 is a view showing an image reader having a first construction in accordance with one embodiment of the present invention. In FIG. 5, a lens array (LA) 30 has a structure similar to that of the lens array 13 illustrated in FIG. 3 showing the general example. Namely, the lens array 30 has an elongated frame body 31 and many convex lenses 32 arranged in a line inside the frame body 31 and spaced from each other at an equal interval. The frame body 31 and the convex lenses 32 are integrally formed by pressing and molding a transparent material such as plastic, etc. However, different from the general example, shield plates 33 are arranged between adjacent convex lenses 32.

The shield plates 33 are arranged to prevent light from passing around between the adjacent convex lenses 32. A surface of each of the shield plates 33 is desirably coated in black (or nonreflectively coated) to prevent irregular reflection of light.

In such a construction, a light portion having a small incident angle among light incident to the lens array 30 can be cut by a shield plate 33. This light portion is a portion of light having an incident angle showing a height equal to or lower than that of the shield plate 33. Accordingly, it is possible to prevent light from passing around between adjacent convex lenses 32 so that generation of flare is reliably avoided. Therefore, for example, rise of an output voltage level of a black image and interruption of thin lines of the black image can be prevented so that the quality of a read image can be improved. The shield plate 33 may be molded integrally with the lens array 30. Otherwise, the shield plate 33 may be separately formed and adhered between the convex lenses 32.

Figure 6:
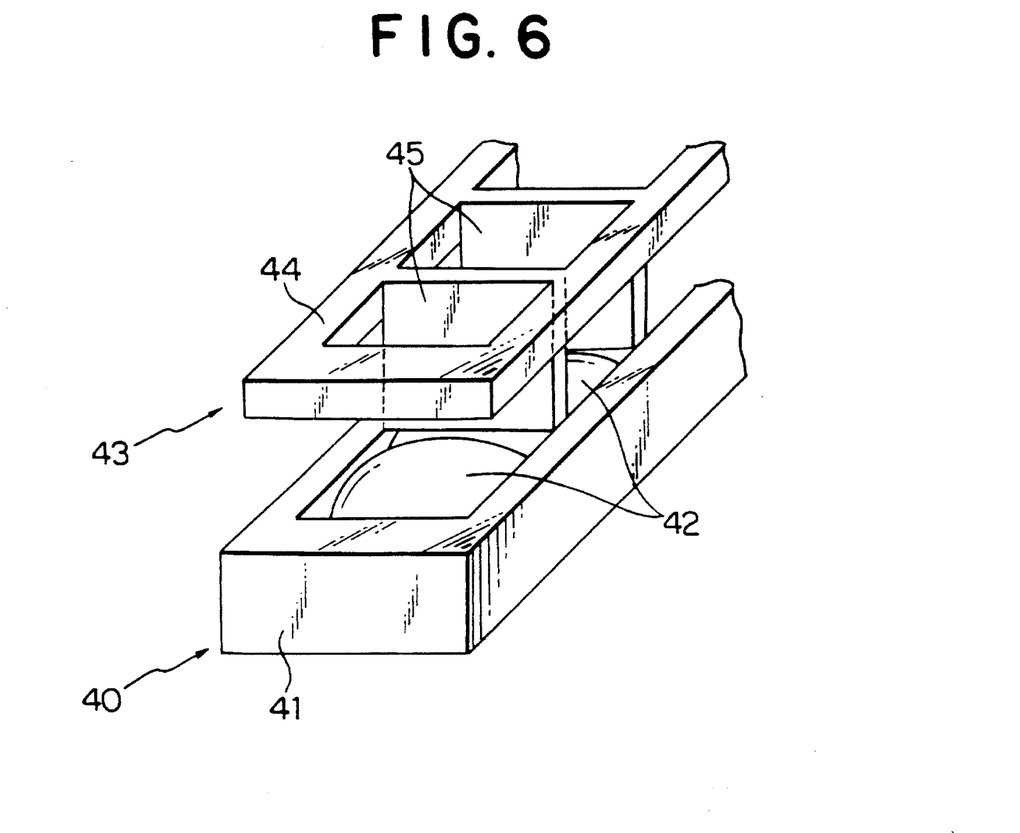
FIG. 6 is a view showing the construction of an image reader having a second construction in accordance with one embodiment of the present invention.
Figure 7:
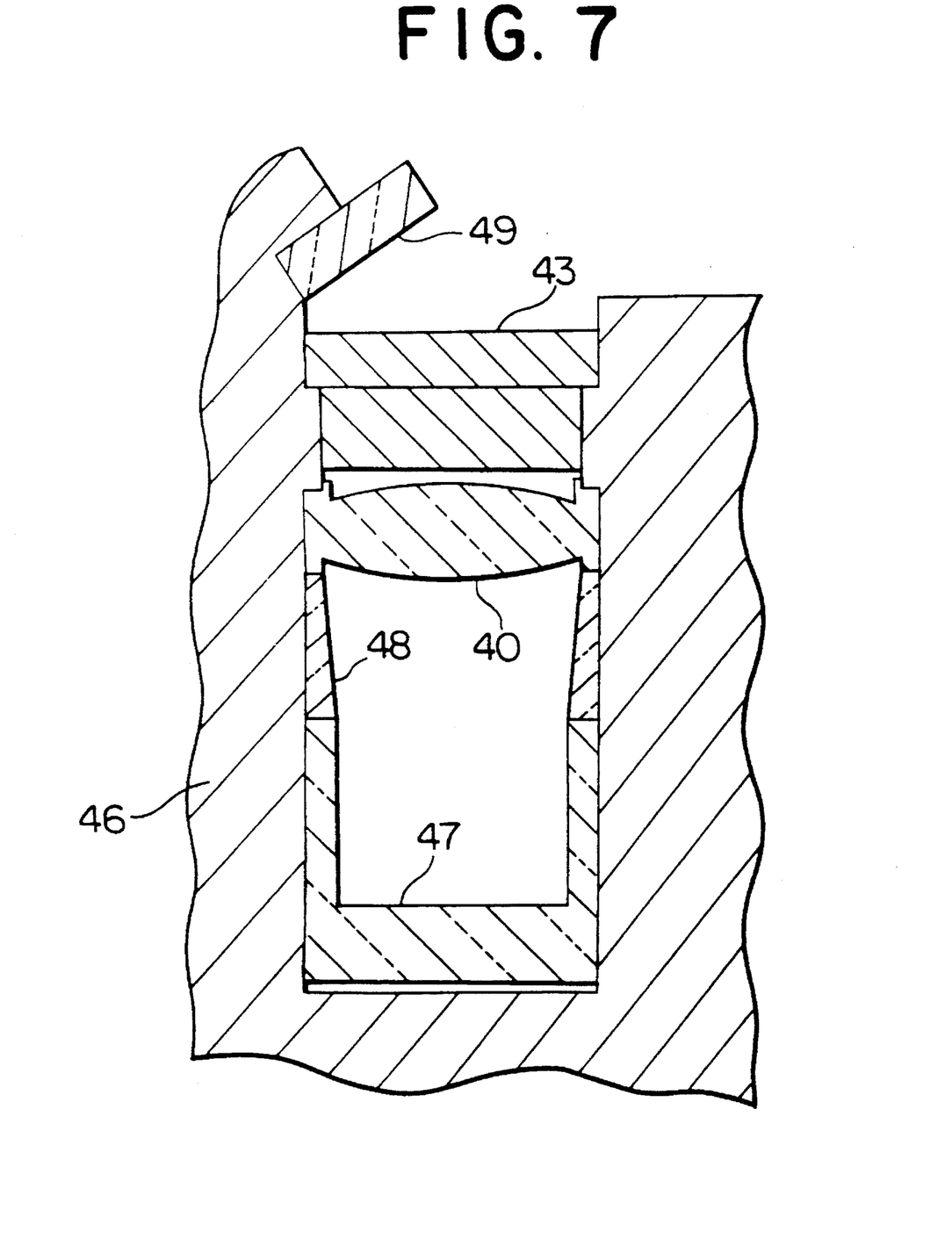
FIG. 7 is a cross-sectional view showing a main portion of the image reader having the second construction.

(2) Each of FIGS. 6 and 7 is a view showing an image reader having a second construction in accordance with one embodiment of the present invention. In FIGS. 6 and 7, a lens array (LA) 40 has a structure similar to that of the lens array 13 illustrated in FIG. 3 showing the general example. Namely, the lens array 40 has an elongated frame body 41 and many convex lenses 42 arranged in a line inside the frame body 41 and spaced from each other at an equal interval. The frame body 41 and the convex lenses 42 are integrally formed by pressing and molding a transparent material such as plastic, etc.

A light shielding portion 43 is arranged on the lens array 40. This light shielding portion 43 is constructed by a frame body 44 approximately having the same length and width as the lens array 40. The light shielding portion 43 is also constructed by many light shield plates 45 attached to the frame body 44 at the same interval as the convex lenses 42 in a rectangular projecting tooth shape (in a supporting tooth shape of a geta in Japan).

FIG. 7 shows a state in which the lens array 40 and the light shielding portion 43 are assembled into a reading unit. Reference numerals 48, 47, 48 and 49 respectively designate a case of the reading unit, a roof mirror array, an intermediate member and an optical path separating mirror corresponding to the case 4, the roof mirror array 15, the intermediate member 14 and the optical path separating mirror 8 shown in FIG. 1.

In such a construction, a light portion having a small incident angle among light incident to the lens array 40 can be cut by a light shield plate 45. This light portion is a portion of light having an incident angle showing a height equal to or lower than that of the light shield plate 45. Accordingly, it is possible to prevent light from passing around between adjacent convex lenses 42 so that generation of flare is reliably avoided. Therefore, for example, rise of an output voltage level of a black image and interruption of thin lines of the black image can be prevented so that the quality of a read image can be improved. Further, the light shielding portion 43 can be supplied as a separate part so that the existing lens array 40 can be used as it is. The light shielding portion 43 may be integrally molded. Otherwise, the frame body 44 and the light shield plate 45 may be separately formed and combined with each other. A surface of the light shield plate 45 may be coated in black (or nonreflectively coated).

Figure 8:
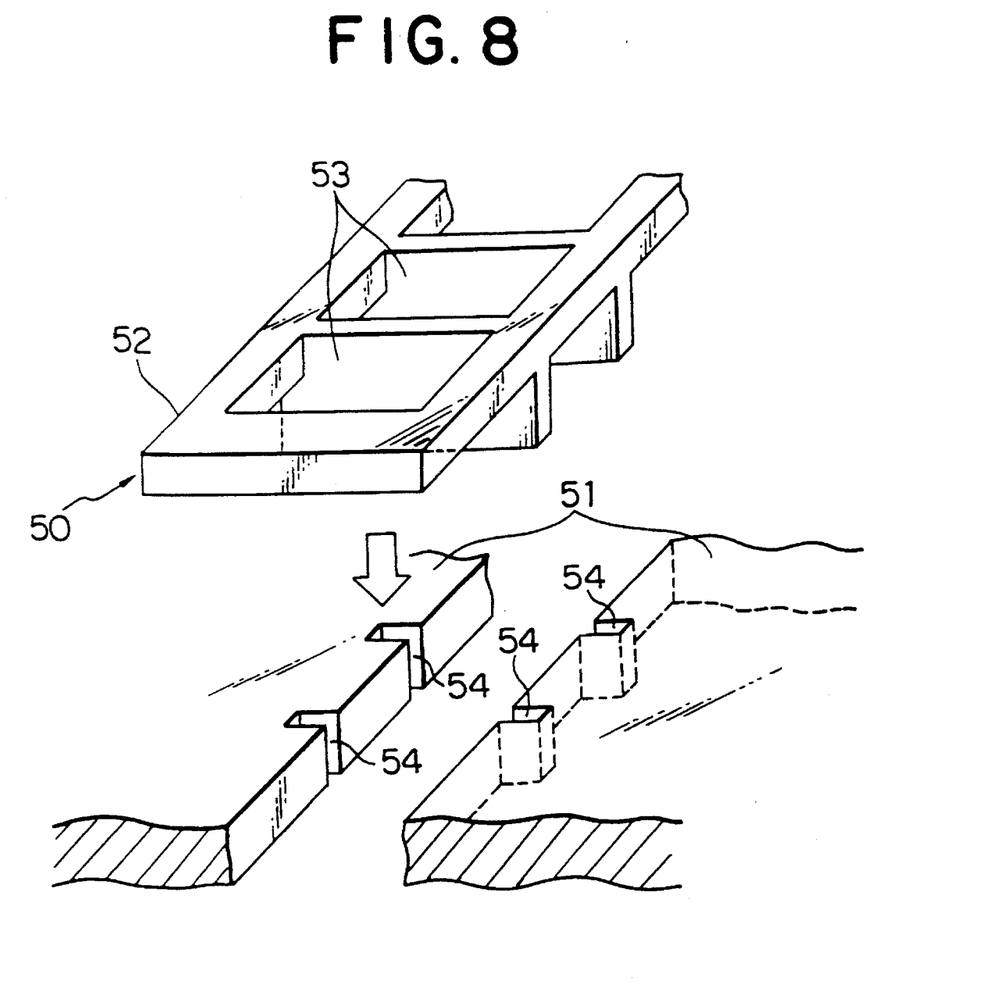
FIG. 8 is a view showing the construction of an image reader having a third construction in accordance with one embodiment of the present invention.

(3) FIG. 8 is a view showing an image reader having a third construction in accordance with one embodiment of the present invention. In FIG. 8, reference numerals 50 and 51 respectively designate a light shielding portion and a case portion of a reading unit located just above an attaching position of a lens array (LA) (see the case 4 shown in FIG. 1).

The light shielding portion 50 has a frame body 52 approximately having the same length and width as the lens array (see the lens array 13 shown in FIG. 3). The light shielding portion 50 also has many light shield plates 53 attached to the frame body 52 at the same interval as convex lenses (see the convex lenses 17 shown in FIG. 3) in a rectangular projecting tooth shape (in a supporting tooth shape of a geta in Japan). Each of the light shield plates 53 is fitted into each of grooves 54 formed at the same interval as the convex lenses in the above case portion 51 located just above the attaching position of the lens array.

Figure 9:
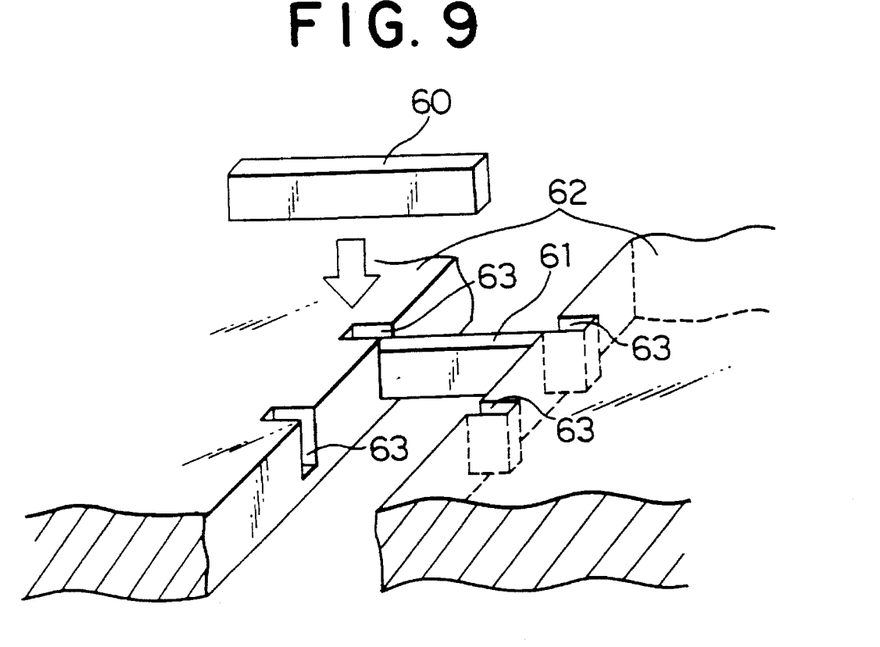
FIG. 9 is a view showing the construction of an image reader having a fourth construction in accordance with one embodiment of the present invention.

In accordance with such a construction, each of the light shield plates 53 can be firmly fixed to each of the grooves 54. Therefore, it is possible to prevent the light shielding portion 50 from being moved and shaken by vibrations caused by moving the reading unit. Accordingly, a change in amount of light transmitted through the lens array (LA) is prevented so that a reading operation of the image reader can be stabilized. (4) FIG. 9 is a view showing an image reader having a fourth construction in accordance with one embodiment of the present invention. In Fig. 9, each of reference numerals 60 and 61 designates a light shield plate. A case portion 62 of a reading unit is located just above an attaching position of a lens array (LA) (see the case 4 shown in FIG. 1).

Each of the light shield plates 60 and 61 has a simple shape such as a plate shape. Each of the light shield plates 60 and 61 is fitted into each of grooves 63 formed at the same interval as convex lenses in the above case portion 62 located just above the attaching position of the lens array.

In accordance with such a construction, each of the light shield plates 60 and 61 can be firmly fixed to each of the grooves 63 and can be formed in a simple shape such as a plate shape so that cost of the image reader can be reduced.

Figure 10:
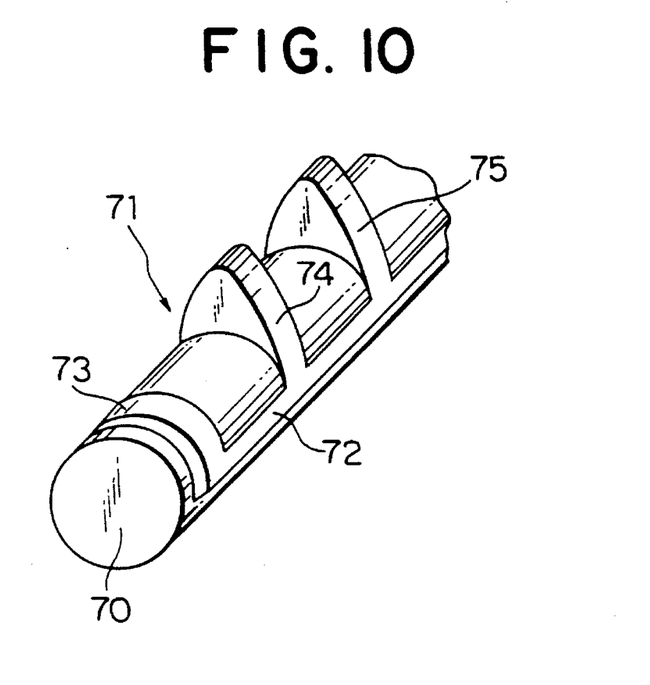
FIG. 10 is a view showing the construction of an image reader having a fifth construction in accordance with one embodiment of the present invention.

(5) FIG. 10 is a view showing an image reader having a fifth construction in accordance with one embodiment of the present invention. In FIG. 10, a light source 70 is constructed by a fluorescent lamp, a halogen lamp, etc. A light shielding portion 71 is attached onto a surface of the light source 70. This light shielding portion 71 is constructed by two parallel long frames 72, two short frames 73 and many light shield plates 74, 75. One of the two parallel long frames 72 is hidden on a rear side of the light source 70 so that this one frame cannot be seen in FIG. 10. The two parallel long frames 72 extend along a longitudinal surface of the light source 70. Only one of the two short frames 73 is shown in FIG. 10. The two short frames 73 connect ends of the two long frames 72 to each other. The light shield plates 74 and 75 are arranged at an equal interval between the two short frames 73 and are attached onto the surface of the light source 70 in a rising state. The attaching interval of the light shield plates 74 and 75 is equal to that of convex lenses of a lens array (see the convex lenses 17 in FIG. 3).

In accordance with such a construction, irradiated light having a small incident angle showing a height equal to or lower than that of each of the light shield plates 74 and 75 can be shielded by the light shield plates 74 and 75. Accordingly, it is possible to prevent light from passing around between adjacent convex lenses of the lens array (LA) so that generation of flare is reliably avoided. Therefore, for example, rise of an output voltage level of a black image and interruption of thin lines of the black image can be prevented so that the quality of a read image can be improved. A surface of each of the light shield plates 74 and 75 may be coated in black (or nonreflectively coated). Further, in this embodiment, the light shield plates 74 and 75 are arranged on a side of the light source so that processing accuracy of the image reader can be set to be lower than that in a case in which the light shield plates 74 and 75 are arranged on a side of the lens array. Accordingly, the image reader can be cheaply manufactured.

Figure 11A:
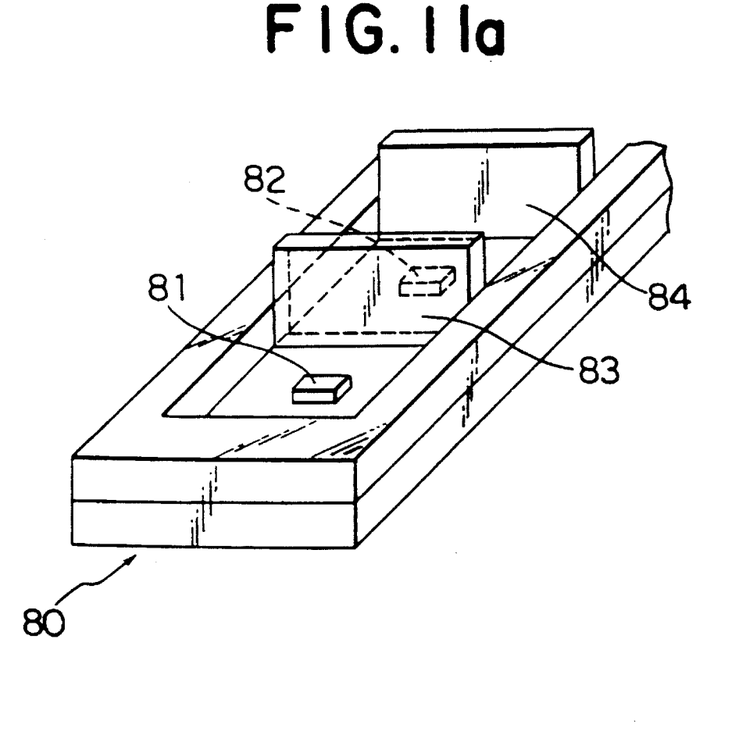
Figure 11B:
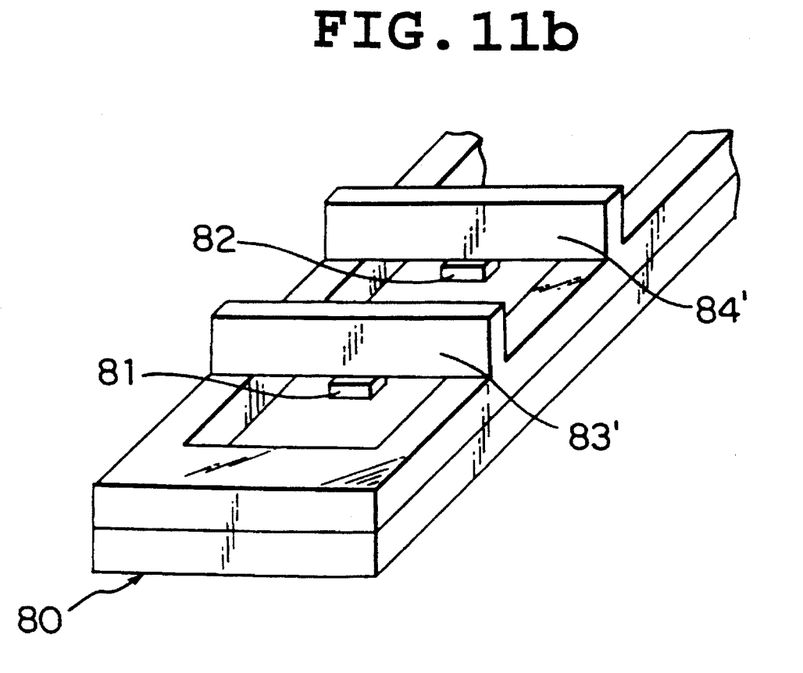
Figure 12:
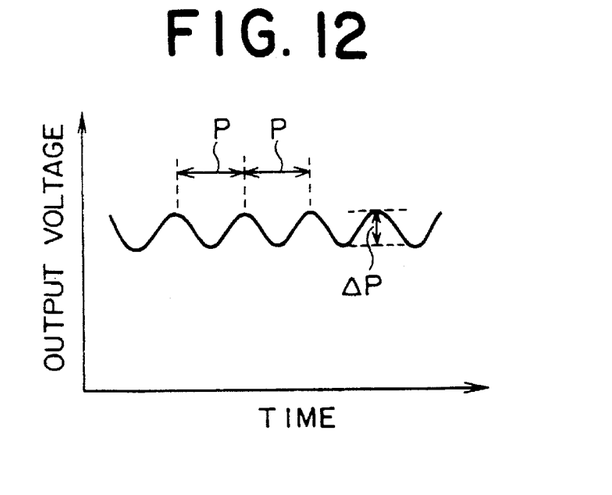
FIG. 12 is a graph showing output characteristics of photoelectric conversion of the image reader having the sixth construction.

(6) Each of FIGS. 11 and 12 is a view showing an image reader having a sixth construction in accordance with one embodiment of the present invention. In FIGS. 11a and 11b, a light source 80 has many point light sources 81, 82 each formed by a light emitting diode (LED), etc. Each of light shield plates 83 and 84 (or light shield plates 83' and 84' ) is attached to the light source 80 at the same interval as an arranging interval of the point light sources 81 and 82. Position relations of the point light sources 81, 82 and the light shield plates 83, 84 shown in FIG. 11a are different from position relations of the point light sources 81, 82 and the light shield plates 83', 84' shown in FIG. 11b. Namely, in FIG. 11a, each of the light shield plates 83 and 84 is approximately located in an intermediate position between the point light sources 81 and 82. In contrast to this, in FIG. 11b, each of the light shield plates 83' and 84' is located just above each of the point light sources 81 and 82.

A layout shown in FIG. 11a is suitable when a distance between the point light sources 81 and 82 is small. In contrast to this, a layout shown in FIG. 11b is suitable when the distance between the point light sources 81 and 82 is large.

FIG. 12 is a graph showing output characteristics of photoelectric conversion of the image reader provided when the light source having the point light sources is used. An output voltage in FIG. 12 has a wavy shape formed at the same pitch P as the arranging interval of the point light sources. An irregular output voltage pitch ΔP as an irregular light amount corresponding to a wave depth is caused so that the quality of a read image is reduced by this irregular output voltage pitch.

When the distance between the point light sources is large, a wave crest appears in a peak position of a light distribution of each of the point light sources. Accordingly, in this case, it is sufficient to arrange each of the light shield plates in a position in which a peak of the light distribution of each of the point light sources can be restrained. Namely, it is sufficient to arrange each of the light shield plates just above each of the point light sources. Accordingly, it is sufficient to use the layout shown in FIG. 11b.

In contrast to this, when the distance between the point light sources is small, a wave crest appears in an overlapping portion of light distributions of adjacent light sources. In other words, the wave crest appears in a base portion of the light distributions. Accordingly, in this case, it is sufficient to arrange each of the light shield plates in a position in which an added light amount obtained by overlapping the light distributions of the adjacent point light sources can be restrained. Namely, it is sufficient to approximately arrange each of the light shield plates in an intermediate position between the adjacent point light sources. Accordingly, it is sufficient to use the layout shown in FIG. 11a.

In accordance with such a construction, irradiated light having a small incident angle showing a height equal to or lower than that of each of the light shield plates 83 and 84 can be shielded by the light shield plates 83 and 84. Otherwise, irradiated light having a small incident angle showing a height equal to or lower than that of each of the light shield plates 83' and 84' can be shielded by the light shield plates 83' and 84'. Further, when the layout shown in FIG. 11a or 11b is used, disadvantages peculiar to the point light sources can be removed. Namely, an irregular light amount is restrained so that the quality of a read image can be improved as remarkable effects.

Figure 13:
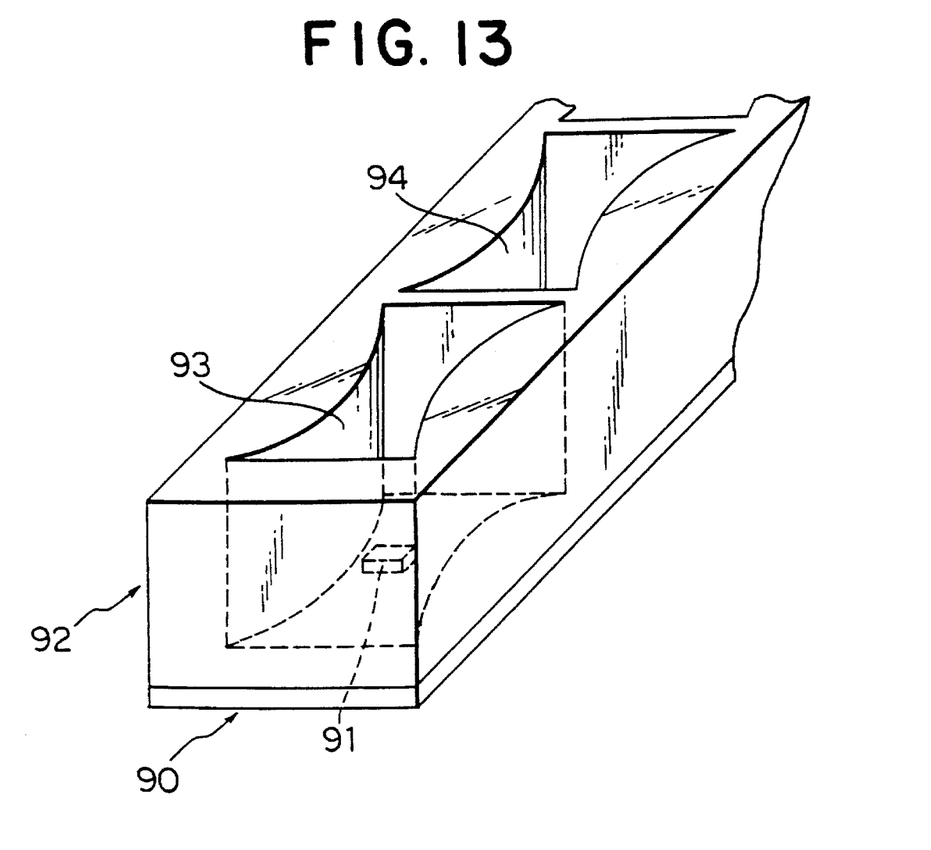
FIG. 13 is a view showing the construction of an image reader having a seventh construction in accordance with one embodiment of the present invention.

(7) FIG. 13 is a view showing an image reader having a seventh construction in accordance with one embodiment of the present invention. In FIG. 13, a light source 90 has many point light sources 91 each formed by a light-emitting diode (LED), etc. Only one of the point light sources 91 is shown in FIG. 13. A light shielding portion 92 has light shielding walls 93 and 94 respectively surrounding the point light sources 91. An opening surrounded by each of the light shielding walls 93 and 94 has a sectional shape formed such that a central portion of this opening just near each of the point light sources 91 is drawn.

In such a construction, irradiated light having a small incident angle showing a height equal to or lower than that of each of the light shielding walls 93 and 94 can be also shielded by the light shielding walls 93 and 94. Further, problems peculiar to the point light sources can be solved. Namely, the point light sources are divided by the light shielding walls 93 and 94 so that no light distributions are overlapped with each other between adjacent point light sources. Further, a peak of each of the light distributions of the point light sources is restrained by drawing the opening section surrounded by each of the light shielding walls 93 and 94. Therefore, an irregular light amount can be restrained so that the quality of a read image can be improved as remarkable effects.

Figure 14A:
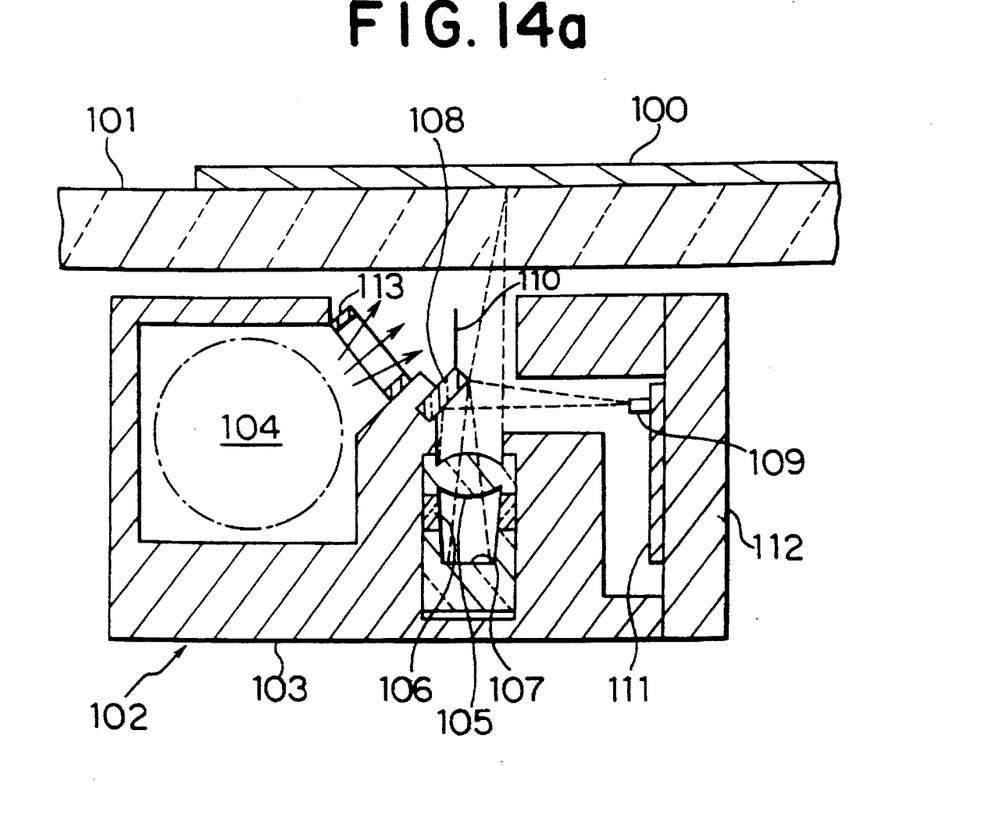
FIG. 14a is a view showing the construction of an image reader having an eighth construction in accordance with one embodiment of the present invention.
Figure 14B:
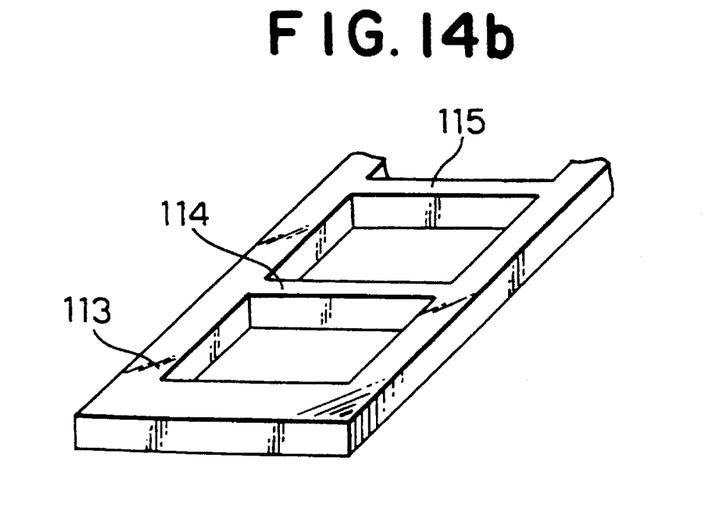
FIG. 14b is a view showing the construction of an image reader having a ninth construction in accordance with one embodiment of the present invention.

FIGS. 14a and 14b are views showing an image reader having an eighth or ninth construction repectively, in accordance with one embodiment of the present invention. In FIG. 14a reference numerals 100, 101 and 102 respectively designate an original, a glass stage and a reading unit. The reading unit 102 has a light source 104, a lens array (LA) 105, an intermediate member 106, a roof mirror array (RMA) 107, an optical path separating mirror 108, a one-dimensional line sensor 109, a shield plate 110, a substrate 111, a base 112, etc. within a case 103. This construction of the reading unit 102 is similar to that in the above-mentioned general example shown in FIG. 1. However, different from this general example, a light shielding portion 113 is arranged in a light irradiating port of the light source 104.

As shown in FIG. 14b, the light shielding portion 113 has a ladder type shape. Rung portions respectively corresponding to rounds of the ladder constitute light shield plates 114 and 115 arranged at the same interval as convex lenses of the lens array 105 (see the convex lenses 17 shown in FIG. 3).

In such a construction, irradiated light having a small incident angle showing a height equal to or lower than that of each of the light shield plates 114 and 115 can be also shielded by the light shield plates 114 and 115. Further, the light shield plates 114 and 115 are arranged on a side of the light source so that processing accuracy of the image reader can be set to be lower than that in a case in which the light shield plates 114 and 115 are arranged on a side of the lens array. Accordingly, the image reader can be cheaply manufactured.

Figure 15A:
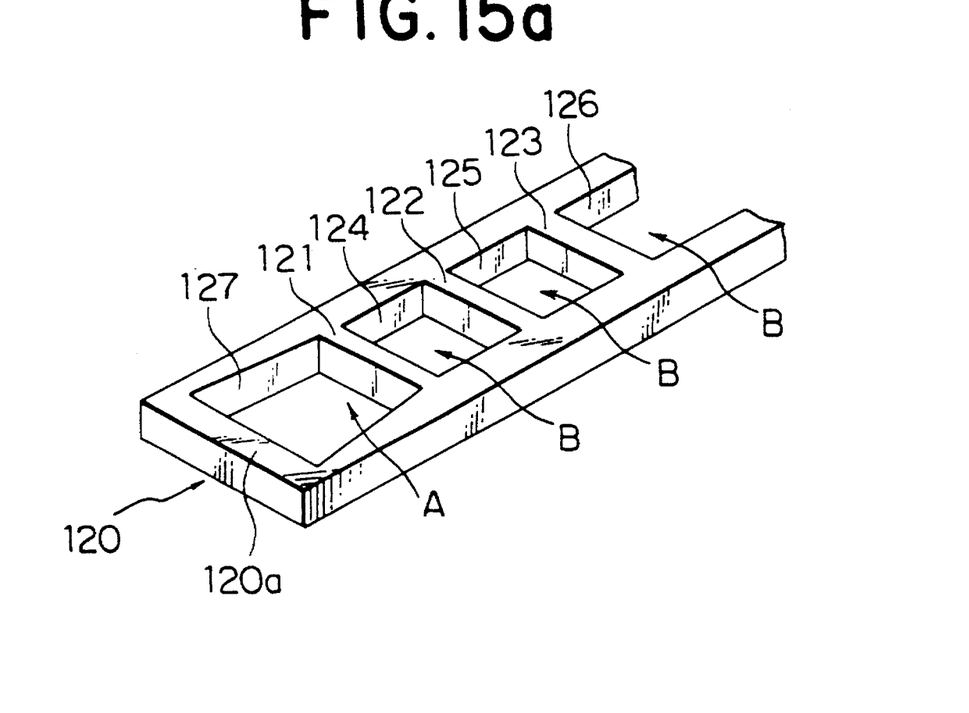
FIG. 15a is a view showing the construction of an image reader having a tenth construction in accordance with one embodiment of the present invention.
Figure 15B:
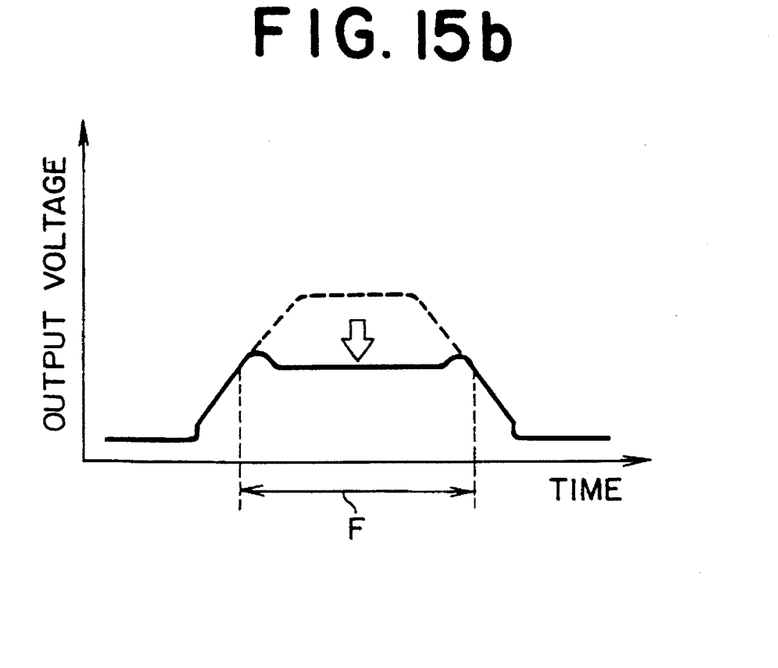

(9) Each of FIGS. 15a and 15b is a view showing an image reader having a tenth construction in accordance with one embodiment of the present invention. In FIG. 15a, a light shielding portion 120 has a ladder type shape as a whole. This ladder type shape is similar to that of the light shielding portion 113 shown in FIG. 14a. However, different from FIG. 14a, openings of rungs of the ladder at both ends thereof are designed such that an area A of each of these openings is larger than an area B of each of openings of the other rungs.

Namely, the light shielding portion 120 in this embodiment has light shield plates 121, 122 and 123 arranged along the longitudinal direction of a light source. Each of openings 124, 125 and 126 having the area B is formed between adjacent light shield plates 121 and 122 or between adjacent light shield plates 122 and 123. An opening 127 having the area A is formed between an end portion 120a of the light shielding portion 120 and the light shield plate 121 located at an end of the light shielding portion 120. The opening area A is set to be larger than the opening area B (A>B).

In accordance with such a construction, a light amount difference corresponding to the difference between the opening areas A and B can be provided between an amount of light transmitted through the opening 127 of the light shielding portion 120 and an amount of light transmitted through each of the other openings 124, 125 and 126. Accordingly, characteristics of photoelectric conversion as shown by a solid line in FIG. 15b can be obtained. Namely, it is possible to obtain characteristics for increasing reading levels of an original in both end portions thereof having an original reading width F.

Such characteristics are suitable when a fluorescent lamp is used as the light source. Both end portions of the fluorescent lamp are darkened with the passage of time so that a light amount of the fluorescent lamp is reduced. If a reading level of the original in each of these both end portions is set to be increased in advance, it is possible to provide reading characteristics in which such deterioration of the fluorescent lamp with the passage of time is considered in advance. It is desirable to set ideal reading characteristics of the original such that an output voltage of the image reader is constant in all regions providing the reading width F. When the reading level of the original rises at each of both ends of these regions as shown by a solid line in FIG. 15b, an output voltage of photoelectric conversion is high at each of these both ends. In this case, the reading characteristics can be easily corrected by making a well-known shading correction such that the output voltage is constant. Accordingly, there is no problem in this case.

As mentioned above, in accordance with the first construction of the image reader, it is possible to prevent light from passing around and shield this light by light shield plates between adjacent convex lenses of a lens array. Accordingly, generation of flare is avoided so that the quality of a read image can be improved.

In accordance with the second construction of the image reader, an interval of the light shield plates can be accurately held by a Frame body so that the quality of a read image can be stably improved.

In accordance with the third construction of the image reader, the interval of the light shield plates can be accurately held by grooves on a case side. Further, it is possible to prevent the light shield plates from being moved and shaken by reliably engaging the light shield plates with the grooves. Accordingly, the quality of a read image can be stably improved when the image reader is vibrated, etc.

In accordance with the fourth construction of the image reader, each of the light shield plates can be formed in a simple shape such as a plate shape so that cost of the image reader can be reduced.

In accordance with the fifth construction of the image reader, it is possible to prevent light from passing around and shield this light by light shield plates arranged on the side of a light source. Accordingly, cost of the image reader can be reduced in comparison with a case in which the light shield plates are arranged on the side of a lens array.

In accordance with the sixth construction of the image reader, it is possible to prevent light from passing around and shield this light by light shield plates arranged on the side of a light source. Further, a distribution of light energy can be uniformed in a longitudinal direction of point light sources. Accordingly, cost of the image reader can be reduced in comparison with a case in which the light shield plates are arranged on the side of a lens array. The quality of a read image can be further improved by restraining irregular light from the light source.

In accordance with the seventh construction of the image reader, distribution characteristics of light energy of a light source can be separately corrected every point light source. The quality of a read image can be further improved by restraining irregular light from the point light source.

In accordance with the eighth and ninth construction of the image reader, it is possible to prevent light from passing around and shield this light by light shield plates arranged on the side of a light source. Accordingly, cost of the image reader can be reduced in comparison with a case in which the light shield plates are arranged on the side of a lens array.

In accordance with the tenth construction of the image reader, an amount of light of the light source in each of both end portions thereof in a longitudinal direction of this light source is increased in comparison with the other portions. Accordingly, for example, when a fluorescent lamp is used, it is possible to obtain suitable light distribution characteristics considering deterioration of the fluorescent lamp with the passage of time.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image reader comprising:

a light source for illuminating an original;

a lens array having many convex lenses arranged at an equal interval and converging light reflected on the original;

a roof mirror array having roof type reflecting faces arranged at the same interval as said convex lenses and reflecting light transmitted through the lens array;

a one-dimensional image sensor for photoelectrically converting the reflected light from the roof mirror array; and many light shield plates attached to said light source such that an attaching interval of the light shield plates is set to be equal to the interval of said convex lenses.

2. An image reader as claimed in claim 1, wherein the image reader further comprises a frame body for holding said light shield plates at an equal interval and the frame body is arranged on an incident light side of said lens array.

3. An image reader as claimed in claim 1, wherein the image reader further comprises a frame body for holding said light shield plates at an equal interval and grooves are formed at an equal interval in a case for holding said lens array such that the light shield plates are respectively engaged with the grooves.

4. An image reader as claimed in claim 1, wherein grooves are formed at an equal interval in a case for holding said lens array such that the light shield plates are independently engaged with the respective grooves.

5. An image reader comprising:

a light source having many point light sources for illuminating an original;

a lens array having many convex lenses arranged at an equal interval and converging light reflected on the original;

a roof mirror array having roof type reflecting faces arranged at the same interval as said convex lenses and reflecting light transmitted through the lens array;

a one-dimensional image sensor for photoelectrically converting the reflected light from the roof mirror array; and many light shield plates attached to said light source such that an attaching interval of the light shield plates is set to be equal to an interval of said point light sources;

each of said light shield plates being approximately located in an intermediate position between the point light sources, or being located just above each of the point light sources.

6. An image reader comprising:

a light source having many point light sources for illuminating an original;

a lens array having many convex lenses arranged at an equal interval and converging light reflected on the original;

a roof mirror array having roof type reflecting faces arranged at the same interval as said convex lenses and reflecting light transmitted through the lens array;

a one-dimensional image sensor for photoelectrically converting the reflected light from the roof mirror array; and a light shielding wall surrounding each of said point light sources and continuous by a predetermined distance in an irradiating direction of light.

7. An image reader comprising:

a light source for illuminating an original;

a lens array having many convex lenses arranged at an equal interval and converging light reflected on the original;

a roof mirror array having roof type reflecting faces arranged at the same interval as said convex lenses and reflecting light transmitted through the lens array;

a one-dimensional image sensor for photoelectrically converting the reflected light from the roof mirror array; and many light shield plates interposed and arranged between the light source and the original in a longitudinal direction of the light source.

8. An image reader as claimed in claim 7, wherein the interval of a light shield plate located near an arranging end of said light shield plates is set to be wider than intervals of the other light shield plates.

9. An image reader as claimed in claim 7, wherein an arranging interval of said light shield plates is set to be equal to the interval of said roof type reflecting faces of the roof mirror array.

* * * * *